(12) United States Patent
Chen

(10) Patent No.: US 7,986,036 B2
(45) Date of Patent: Jul. 26, 2011

(54) POWER/GROUND NETWORK OF INTEGRATED CIRCUITS AND ARRANGEMENT THEREOF

(75) Inventor: Xiaoshan Chen, Taipei (TW)

(73) Assignee: VIA Technologies, Inc., Taipei (TW)

( * ) Notice: Subject to any disclaimer, the term of this patent is extended or adjusted under 35 U.S.C. 154(b) by 1023 days.

(21) Appl. No.: 11/834,677

(22) Filed: Aug. 6, 2007

(65) Prior Publication Data

US 2008/0048331 A1    Feb. 28, 2008

(30) Foreign Application Priority Data

Aug. 25, 2006   (CN) .......................... 2006 1 0125680

(51) Int. Cl.
*H01L 23/52* (2006.01)
*H01L 23/528* (2006.01)
*G06F 17/50* (2006.01)

(52) U.S. Cl. ................. 257/691; 257/692; 257/E23.153; 716/127; 716/133; 327/524

(58) Field of Classification Search ........... 257/E23.153, 257/691, 962; 327/524; 716/127, 133
See application file for complete search history.

(56) References Cited

U.S. PATENT DOCUMENTS 6,794,674 B2 * 9/2004 Kusumoto .................... 327/524

* cited by examiner

Primary Examiner — Zandra Smith
Assistant Examiner — Tsz K Chiu
(74) Attorney, Agent, or Firm — Thomas, Kayden, Horstemeyer & Risley, LLP

(57) ABSTRACT

An arrangement scheme for a power/ground (P/G) network of an integrated circuit is provided. Rows of standard cells in the integrated circuit are horizontally arranged. The P/G network has horizontal and vertical metal lines arranged in different metal layers. The horizontal metal lines have horizontal power metal lines and horizontal ground lines. The vertical metal lines have vertical power metal lines and vertical ground lines. The power lines and the ground lines in the horizontal metal lines are respectively interconnected with the power lines and the ground lines of the vertical metal lines. The width of the horizontal metal wires in the P/G network is such that the horizontal power metal lines only cover the power lines in the rows of the standard cells, while the horizontal ground metal lines only cover the ground lines of the rows of the standard cells. By employing the technical features of the present invention compliant with the conditions of IR drop, power consumption and noise, the P/G network is rearranged and the metal line width can be determined based on the design rules for integrated circuit and the repeatability of the rows of the standard cells, thus avoiding function failure or waste of layout resources due to overlapping or inappropriate line width, thereby accommodating the requirement for chip designs.

25 Claims, 6 Drawing Sheets

Dispose horizontal metal lines and vertical metal lines in different metal layers, wherein width of horizontal metal lines of P/G network is set Connect power lines and ground lines of horizontal metal lines to power lines and ground lines of vertical metal lines respectively Connect power lines and ground lines of vertical metal lines to power lines and ground lines of rows of standard units respectively Calculate density of horizontal and vertical metal lines in P/G network

FIG. 5

POWER/GROUND NETWORK OF INTEGRATED CIRCUITS AND ARRANGEMENT THEREOF

FIELD OF THE INVENTION

The present invention relates to the field of integrated circuit design, and more particularly, to a power/ground (P/G) network of an integrated circuit and arrangement thereof.

BACKGROUND OF THE INVENTION

The technology of integrated circuits has developed rapidly. Along with the increase in scale of circuits, the faster the speed. Meanwhile, the number of gate count in the circuits increases accordingly. The integrated circuits require a more reliable power supply to ensure normal function. The expansion of circuit scale requires more and more transistors, which are usually realized in stack configurations to effectively control the area of the chip. Thus, how to supply power to these transistors becomes a crucial question. Normally, there are two kinds of power supply according to different packaging methods: one is called "topside power supply" mostly used in flip-chip packages; the other is called "lateral power supply" (used for wire-bonding). Topside power supply is more advantageous than the lateral power supply.

Electrical elements' connection in the integrate circuits are configured in stacks together to effectively control chip area. Thus, such structure presents certain difficulties in terms of power supply. In order to address the problems with power supply of a chip in the flip-chip packaging, power/ground (P/G) network provide power supply to all transistors. More specifically, power lines and ground lines of the standard cells with a wide range of functionalities are respectively connected to power stripes and ground stripes in the P/G network, which is then connected to an external power supply, thereby realizing power delivery.

It should be noted here that since the present invention is mainly directed to improvement of P/G network, thus hereinafter, circuit cells regardless of their functionalities are simplified as circuit cells with a power line and a ground line, referred to as "standard cells". Meanwhile, all the standard cells have the same height, while the widths of the cells may vary. Additionally, this uniform height of the standard cells is referred to as "standard height".

In current large-scale circuit designs where the size and speed of the circuits increase relentlessly, although multi-layers of metal are used, resources for interconnections (i.e. P/G network resources) are still relatively insufficient. In order to get more interconnection resources, the chip area is forced to enlarge. However, this brings problems such as increased cost, timing and IR drop.

Current P/G network designs for large-scale circuit do not take the sizes of the standard cells and their power/ground width into account, as described in FIG. 1A. FIG. 1A is a schematic diagram illustrating a layout of a P/G network. In the drawing, designations of "standard cells" are omitted, only their power lines Vdd and ground lines Vss are indicated. Additionally, it should be noted that the Vdd and Vss are spaced apart, and the space between them indicates the "standard height" for fitting a single "standard cell". "Standard cells" are arranged back-to-back, such that two "standard cells" share the same Vdd or Vss. Other arrangements are possible to one skilled in the art, and appropriate modifications are made when applying the technical features of the present invention. The following descriptions of the present invention will be made with respect to this commonly seen arrangement as shown in FIG. 1A. Normally, the row direction of the standard cells is called the horizontal direction (It should be noted that "vertical" and "horizontal" directions refer to the layout directions, wherein the row direction of the standard cells is called the "horizontal" direction while the direction perpendicular to it is called the "vertical" direction). Typically, a metal stripe in the horizontal direction is located at a higher layer while a metal stripe in the vertical direction is located at a lower layer. Referring still to FIG. 1A, in current technique, the width of the metal stripes is not carefully calculated, so it is often larger than twice of the standard height. As a result, the width of a single metal stripe may cover standard cell's power line Vdd and ground line Vss simultaneously. Thus, metalstripes n layers higher than that the layer on which the power lines Vdd and ground lines Vss of the standard cells reside are used as vertical metal lines 101P and 101G; while metalstripes n+1 layers higher are used as horizontal metal lines 102P and 102G. in the P/G (power/ground) network. (FIG. 1A is viewed from a bottom-up perspective, so Vdd and Vss are seen first and the vertical metal lines 101P and 101G and the horizontal metal lines 102P and 102G are partially blocked). The reason for doing this is that the power lines Vdd or ground lines Vss of all the standard cells can all be connected to the vertical metal stripes of P/G network. As shown in FIG. 1A, Vdd and Vss connect to 101G and 101P respectively through Vias 100. Since the power lines Vdd and the ground lines Vss of the standard cells are horizontally arranged, they connect to the metal stripes of P/G network in the vertical direction, without causing P/G short. The metal stripes of P/G network in the vertical direction must be lower-layer metals, while the metal stripes of P/G network in the horizontal direction is higher-layer metals.

If the higher-layer metals are vertical and the lower-layer metals are horizontal, then metalstripes of P/G network n layer higher than that of the power lines Vdd or ground lines Vss of the standard cells are used as the horizontal metalstripes, while the metalstripes of P/G network n+1 layer higher are used as the vertical metal stripes, as shown in FIG. 1B. In this case, part of the power lines Vdd or ground lines Vss of the standard cells are prevented from connecting to the vertical P/G network at the higher layer (n+1) by the horizontal P/G network at the lower layer (n), causing IR drop and other problems. Referring to FIG. 1B (similarly viewed from a bottom-up perspective), metal stripes of P/G network 103P and 103G n+1 layer higher than the power lines Vdd or ground lines Vss of the standard cells are vertical while metal stripes 104P and 104G n layer higher than the power lines Vdd or ground lines Vss of the standard cells are horizontal. In this case, such as the location indicated by block 105, the power lines Vdd or ground lines Vss of the standard cells cannot connect to the higher-layer metal stripes 103P or 103G since they are blocked by the lower-layer metal stripes 104P and 104G, causing IR drop and other problems. In view of this, if in the current design, a chip employs 2n-layer metal fabrication technique as well as flip-chip packaging, then metals at the (2n−1)th layer are designed as P/G network in the horizontal direction, while metals at the (2n−2)th layer and the (2n)th layer stacked on top of that are used as power and ground stripes in the vertical direction, i.e. there are two layers of vertical P/G lines. This would eliminate the problem of overlapping as shown in FIG. 1B. However, it would take up too much layout resources.

From the above, it can be seen that one main reason for inefficient usage of layout resources and high cost is the unreasonable design of the P/G networks, wherein components are not elaborately arranged and the resources are unreasonable deployed. Therefore, there is a need for a more reasonable P/G network arrangement in order to accommodate the requirements in chip designs.

SUMMARY OF THE INVENTION

In the light of forgoing drawbacks, an objective of the present invention is to provide a novel P/G network arrangement that can accommodate the requirement for increasing number of gate count by more efficiently arranging the P/G network.

According to one aspect of the present invention, a power/ground (P/G) network of an integrated circuit is proposed, wherein rows of standard cells in the integrated circuit are horizontally arranged, the P/G network including horizontal and vertical metal stripes arranged in different metal layers, the horizontal metal stripes including horizontal power metal stripes and horizontal ground stripes, the vertical metal stripes including vertical power metal stripes and vertical ground stripes, the power and the ground in the horizontal metal stripes respectively interconnected with the power and the ground of the vertical metal stripes; the width of the horizontal metal stripes in the P/G network is such that the horizontal power metal stripes only cover the power lines of the standard cells, while the horizontal ground metal stripes only cover the ground lines of the standard cells.

According to the present invention, the width of the horizontal metal stripes is smaller than twice a standard height of the standard cells. According to an embodiment of the present invention, the width of the horizontal metal stripes is no wider than: 2×standard height−1×P/G width of a standard cell−2×metal space, wherein the P/G width of a standard cell is the width of a power line or the width of a ground line of a standard cell, which are identical, and the metal space is the space that should be reserved between a horizontal metal stripe of P/G network and a power or a ground line of a standard cell. The width of the metal stripes of P/G network and metal line space are calculated based on at least one of the factors including IR drop, power consumption, noise, design rules for the integrated circuit and repeatability of the rows of the standard cells.

When two horizontal metal stripes are directly adjacent to each other, the width of the horizontal metal stripes of P/G network being no wider than: 1.5×standard height−0.5×P/G stripe space−0.5×P/G width of standard cell−1×metal space, wherein P/G stripe space is the space that should be reserved between two horizontal metalstripes of P/G network. The width of the metal stripes of P/G network and the space between the metal stripes of P/G network are calculated based on at least one of the factors including IR drop, power consumption, noise, design rules for the integrated circuit and repeatability of the rows of the standard cells.

According to the P/G network of the present invention, the vertical metal stripes reside on a metal layer that is one layer higher or lower than that for the horizontal metal stripes.

According to the P/G network of the present invention, the density of the horizontal metal stripes and vertical metal stripes is calculated based on at least one of the factors including IR drop, power consumption, noise, design rules for the integrated circuit and repeatability of the rows of the standard cells.

According to an embodiment, the power and ground of the horizontal metal stripes respectively connected to the power and ground of the vertical metal stripes, and the power and ground of the vertical metal stripes respectively connected to the power and ground of the standard cells are achieved through Vias.

According to a second aspect of the present invention, a method for arranging a P/G network of an integrated circuit is provided, wherein rows of standard cells in the integrated circuit are arranged in the horizontal direction, the method including: disposing horizontal metal stripes and vertical metal stripes in different metal layers, wherein the horizontal metal stripes includes horizontal power metal stripes and horizontal ground metal stripes while the vertical metal stripes includes vertical power metal stripes and vertical ground metal stripes; connecting the power and ground of the horizontal metal stripes to the power and ground of the vertical metal stripes, respectively; and connecting the power and ground of the vertical metal stripes to the power and ground of the standard cells, respectively, wherein the step of disposing horizontal metal stripes and vertical metal stripes includes setting a width of the horizontal metal stripes of the P/G network such that the horizontal power metalstripes only cover the power lines of the standard cells, while the horizontal ground metalstripes only cover the ground lines of the standard cells;

According to the present invention, the width of the horizontal metalstripes is set to be smaller than twice a standard height of the standard cells. According to an embodiment of the present invention, the width of the horizontal metal stripes is set to be no wider than: 2×standard height−1×P/G width of a standard cell−2×metal space, wherein the P/G width of a standard cell is the width of a power line or the width of a ground line of a standard cell, which are identical, and the metal space is the space that should be reserved between a horizontal metal stripe and a power or a ground line of a standard cell. The space is calculated based on at least one of the factors including IR drop, power consumption, noise, design rules for the integrated circuit and repeatability of the rows of the standard cells.

When two horizontal metal stripes are directly adjacent to each other, the width of the horizontal metalstripes being no wider than: 1.5×standard height−0.5×interval between metal lines−0.5×line width of standard cell−1×inter-line interval, wherein the interval between the metal lines is the interval that should be reserved between two horizontal metal lines. The width of the metal lines and the interval between the metal lines are calculated based on at least one of the factors including IR drop, power consumption, noise, design rules for the integrated circuit and repeatability of the rows of the standard cells.

According to the method of the present invention, the vertical metal lines are disposed on a metal layer that is one layer higher or lower than that for the horizontal metal lines.

According to the method of the present invention, the method further includes calculating the density of the horizontal metal lines and vertical metal lines based on at least one of the factors including IR drop, power consumption, noise, design rules for the integrated circuit and repeatability of the rows of the standard cells.

According to the method of the present invention, the method further includes providing vias such that the power lines and the ground lines of the horizontal metal lines are respectively connected to the power lines and the ground lines of the vertical metal lines, and the power lines and the ground lines of the vertical metal lines are respectively connected to the power lines and the ground lines of the standard cells.

According to a third aspect of the present invention, an integrated circuit structure is provided, including rows of standard cells and a P/G network, wherein rows of standard cells in the integrated circuit are horizontally arranged, the P/G network including horizontal and vertical metal lines arranged in different metal layers, the horizontal metal lines including horizontal power metal lines and horizontal ground lines, the vertical metal lines including vertical power metal lines and vertical ground lines, the power lines and the ground lines in the horizontal metal lines respectively interconnected with the power lines and the ground lines of the vertical metal lines; the width of the horizontal metal wires in the P/G network is such that the horizontal power metal lines only cover the power lines in the rows of the standard cells, while the horizontal ground metal lines only cover the ground lines of the rows of the standard cells.

According to the present invention, the width of the horizontal metal lines is smaller than twice a standard height of the standard cells. According to an embodiment of the present invention, the width of the horizontal metal lines is smaller than: 2×standard height−1×line width of a standard cell−2× inter-line interval, wherein the line width of a standard cell is the width of a power line or the width of a ground line of a standard cell, which are identical, and the inter-line interval is the interval that should be reserved between a horizontal metal line and a power or a ground line of a standard cell. The inter-line interval is calculated based on at least one of the factors including IR drop, power consumption, noise, design rules for the integrated circuit and repeatability of the rows of the standard cells.

When two horizontal metal lines are directly adjacent to each other, the width of the horizontal metal lines being smaller than: 1.5×standard height−0.5×interval between metal lines−0.5×line width of standard cell−1×inter-line interval, wherein the interval between the metal lines is the interval that should be reserved between two horizontal metal lines. The width of the metal lines and the interval between the metal lines are calculated based on at least one of the factors including IR drop, power consumption, noise, design rules for the integrated circuit and repeatability of the rows of the standard cells.

According to the present invention, the vertical metal lines reside on a metal layer that is one layer higher or lower than that for the horizontal metal lines.

According to the present invention, the density of the horizontal metal lines and vertical metal lines is calculated based on at least one of the factors including IR drop, power consumption, noise, design rules for the integrated circuit and repeatability of the rows of the standard cells.

According to the present invention, the power lines and the ground lines of the horizontal metal lines respectively connected to the power lines and the ground lines of the vertical metal lines, and the power lines and the ground lines of the vertical metal lines respectively connected to the power lines and the ground lines of the standard cells are achieved through vias.

By employing the technical features of the present invention compliant with the conditions of IR drop, power consumption and noise, the metal line width can be determined based on the design rules for integrated circuit and the repeatability of the rows of the standard cells, thus avoiding function failure or waste of layout resources due to overlapping or inappropriate line width, thereby accommodating the requirement for chip designs.

BRIEF DESCRIPTION OF THE DRAWINGS

The present invention and other characteristics, properties and advantages can be more fully understood by reading the following detailed description of the preferred embodiments, with reference made to the accompanying drawings, wherein:

FIG. 5 is a flow chart illustrating the method for arranging a P/G network according to an embodiment of the present invention.

DETAILED DESCRIPTION OF THE EMBODIMENTS

Figure 1A:
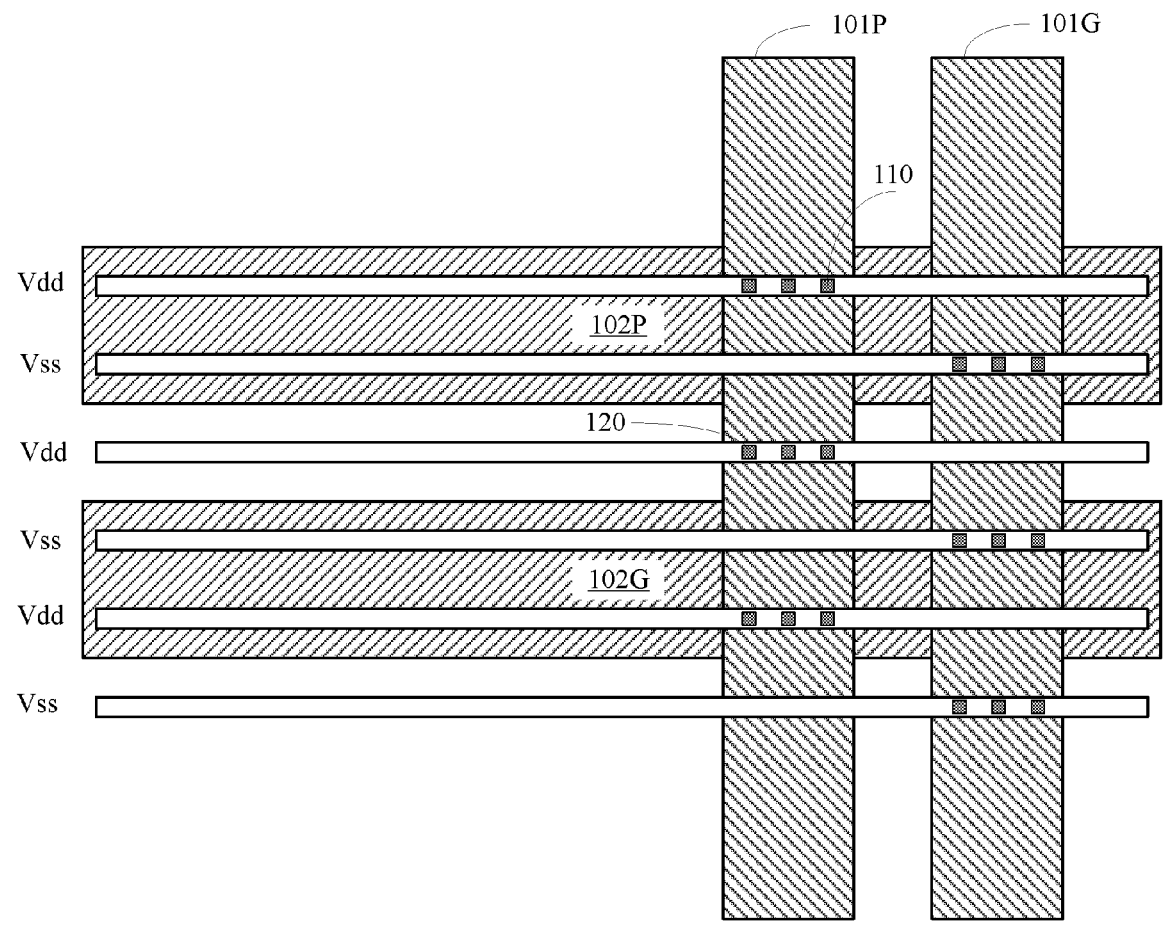
FIG. 1A (PRIOR ART) is a layout structure of a P/G network in the prior art.

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

The primary objective of the present invention is to provide a novel arrangement for P/G network, wherein the rows of the standard cells in the integrated circuit are horizontally arranged. The P/G network includes horizontal and vertical metal lines arranged in different metal layers. The horizontal metal lines include horizontal power metal lines and horizontal ground lines. The vertical metal lines include vertical power metal lines and vertical ground lines. The power lines and the ground lines in the horizontal metal lines and the vertical metal lines are interconnected, respectively. One of the main improvements of the arrangement according to the present invention is that the width of the horizontal metal wires in the P/G network is such that the horizontal power metal lines only cover the power lines in the rows of the standard cells, while the horizontal ground metal lines only cover the ground lines of the rows of the standard cells. With such design, inefficient use of layout resources due to overlapping layouts in the prior art can be eliminated.

In the arrangement of the present invention, the width of the horizontal metal lines is smaller than twice of the standard height, wherein two horizontal metal lines that are not adjacent to each other should not be larger than:

2×standard height−1×line width of standard cell−2× inter-line interval wherein, the line width of a standard cell is the width of a power line or the width of a ground line of the standard cell, which are identical, and the inter-line interval is the interval that should be reserved between a horizontal metal line and a power or a ground line of a standard cell.

For horizontal metal lines that are directly adjacent to each toerh, the width of the horizontal metal lines should not be larger than:

1.5×standard height−0.5×interval between metal lines−0.5×line width of standard cell−1×inter-line interval wherein the interval between metal lines is the interval that should be reserved between two horizontal metal lines.

The inter-line interval and the interval between metal lines are based on at least one of the factors such as IR drop, power consumption, noise, design rules for the integrated circuit and repeatability of the rows of the standard cells.

P/G Network for Integrated Circuit

Firstly, according to one aspect of the present invention, a P/G network for an integrated circuit is proposed, wherein rows of the standard cells in the integrated circuit are horizontally arranged. The P/G network includes horizontal and vertical metal lines arranged in different metal layers. The horizontal metal lines include horizontal power metal lines and horizontal ground lines. The vertical metal lines include vertical power metal lines and vertical ground lines. The power lines and the ground lines in the horizontal metal lines and the vertical metal lines are interconnected, respectively. The width of the horizontal metal wires in the P/G network is such that the horizontal power metal lines only cover the power lines in the rows of the standard cells, while the horizontal ground metal lines only cover the ground lines of the rows of the standard cells.

Figure 1B:
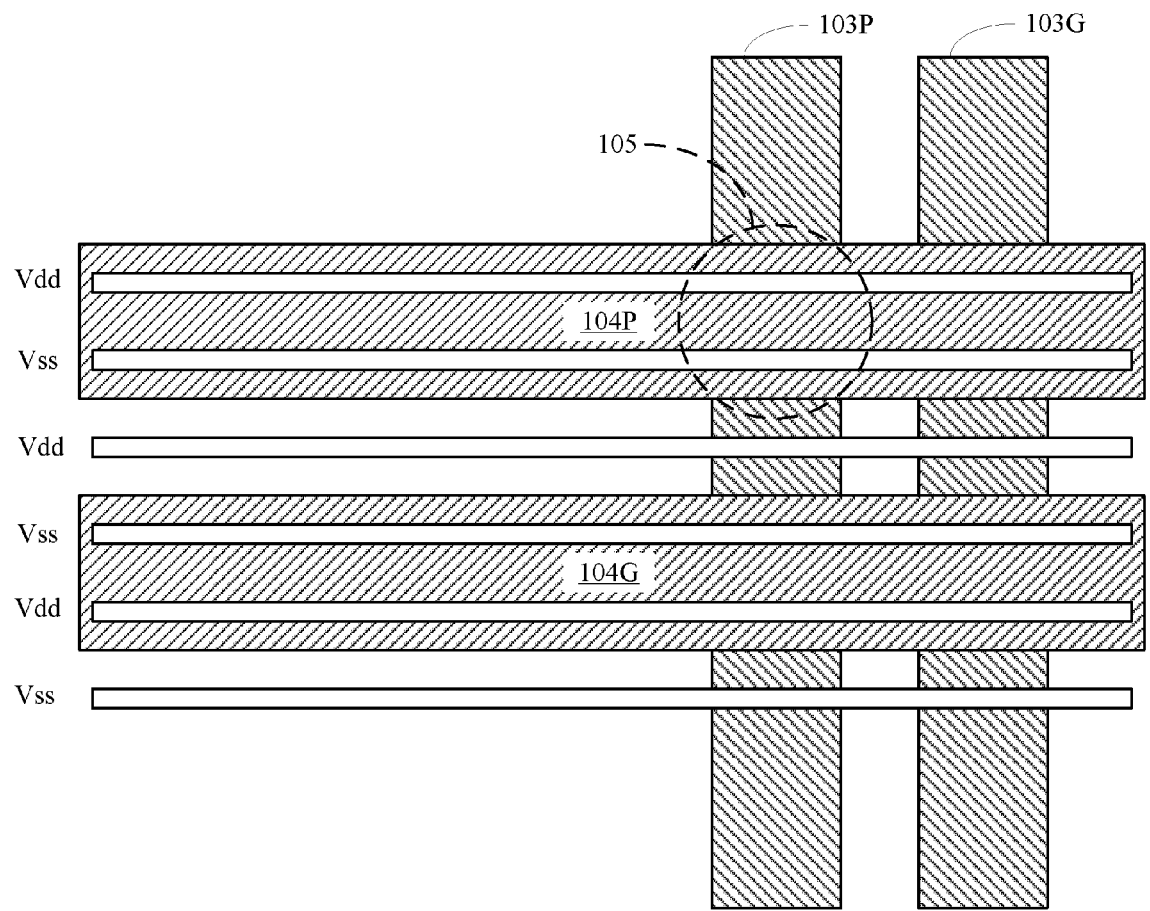
FIG. 1B (PRIOR ART) is another layout structure of a P/G network in the prior art.

In terms of the metal lines in the P/G network, the thicker the lines, the better the power delivery. Thus, under permitted circumstances, selecting the width of the metal lines to be as large as possible is preferable. However, in the prior art, referring to FIGS. 1A and 1B, the widths of the metal lines are randomly chosen without careful calculation. When the width of a metal line is such that it covers both the power line Vdd and ground line Vss of a standard cell (larger than twice the standard height), connections of the Vdd or Vss may be partially affected, so that additional power lines (ground lines) are needed to connect these affected Vdd or Vss, taking up more layout resources and hindering the efficient use of layout resources.

Figure 2:
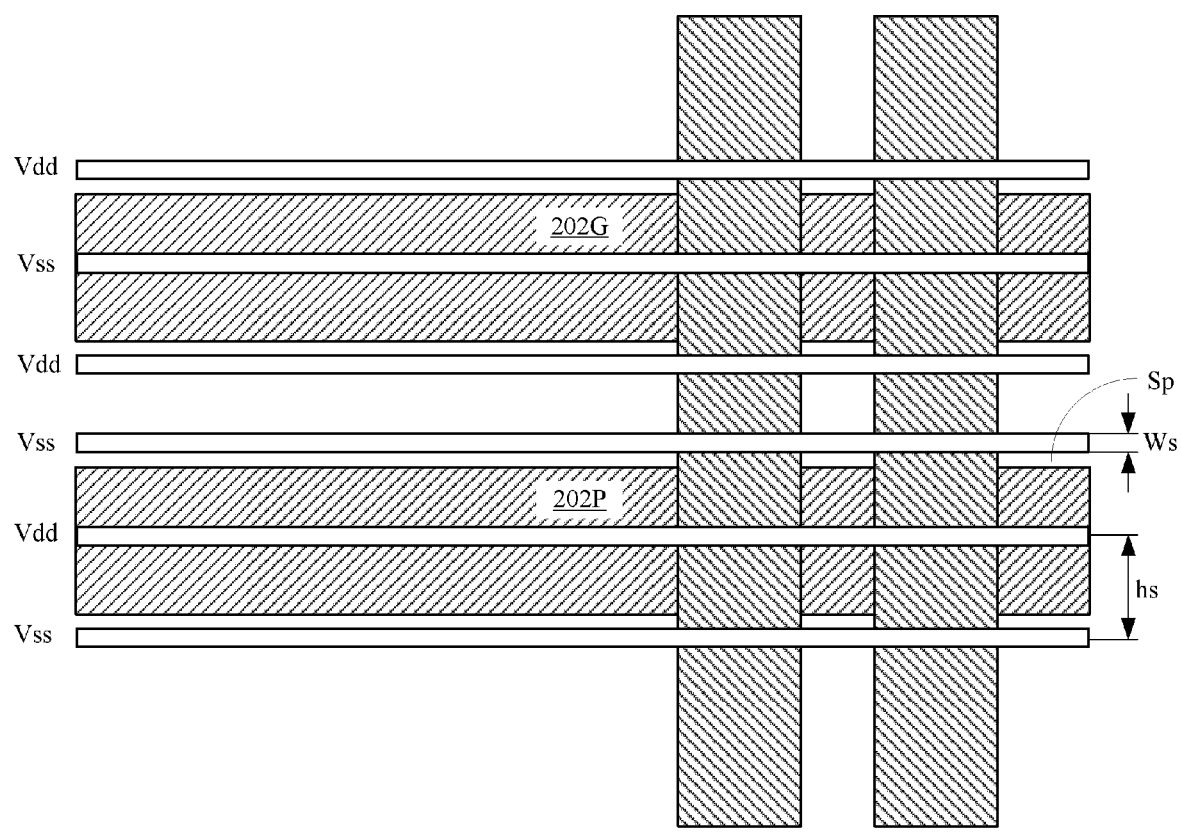
FIG. 2 is a layout structure of a P/G network according to an embodiment of the present invention.

Thus, the present invention proposes that the horizontal power metal lines only cover the power lines in the standard cells and the horizontal ground metal lines only cover the ground lines in the standard cells. Without any overlapping, the connection problem of power lines and ground lines of the standard cells as a result of metal line width being too large as in the prior art can be avoided. Referring to FIG. 2, it can observed from the structure and basic arrangement of the standard cells that the distance between the ground line Vss and the power line Vdd of each standard cell is equal to the height of a single standard cell, that is standard height hs (it should be noted that when considering the widths of Vss and Vdd, the standard height hs is the distance between the center line of Vdd to the center line of Vss). The maximum width possible for any horizontal metal line (horizontal power metal line or horizontal ground metal line) without overlapping is 2hs, that is twice the standard height.

In physical applications, the widths of Vss and Vdd need to be taken into account. In this case, for metal wires that do not have a metal wire right next to it, their width should be not larger than:

2hs−Ws−2Sp, that is, 2×standard height−1×line width of standard cell−2×inter-line interval wherein, the line width Ws of a standard cell is the width of a power line or the width of a ground line of a standard cell, which are identical, and the inter-line interval Sp is the interval that should be reserved between a horizontal metal line and a power or a ground line of a standard cell.

The inter-line interval is reserved to meet the design requirements of the integrated circuits, including IR drop, power consumption, noise, design rules for the integrated circuit and repeatability of the rows of the standard cells. Thus, the inter-line interval Sp is calculated based on at least one of the factors: IR drop, power consumption, noise, design rules for the integrated circuit and repeatability of the rows of the standard cells.

FIG. 2 shows the structure for a configuration where metal lines have no neighboring metal lines at both sides thereof. Similarly, FIG. 2 is viewed from a bottom-up perspective. In this configuration, there are no metal line at either side of horizontal power metal line 202P and horizontal ground metal line 202G, thus there width is given by 2hs−Ws−2Sp. Of course, based on the factors such as IR drop, power consumption, noise, design rules for the integrated circuit and repeatability of the rows of the standard cells, actual layout may have metal lines with a smaller width than described above.

Figure 3:
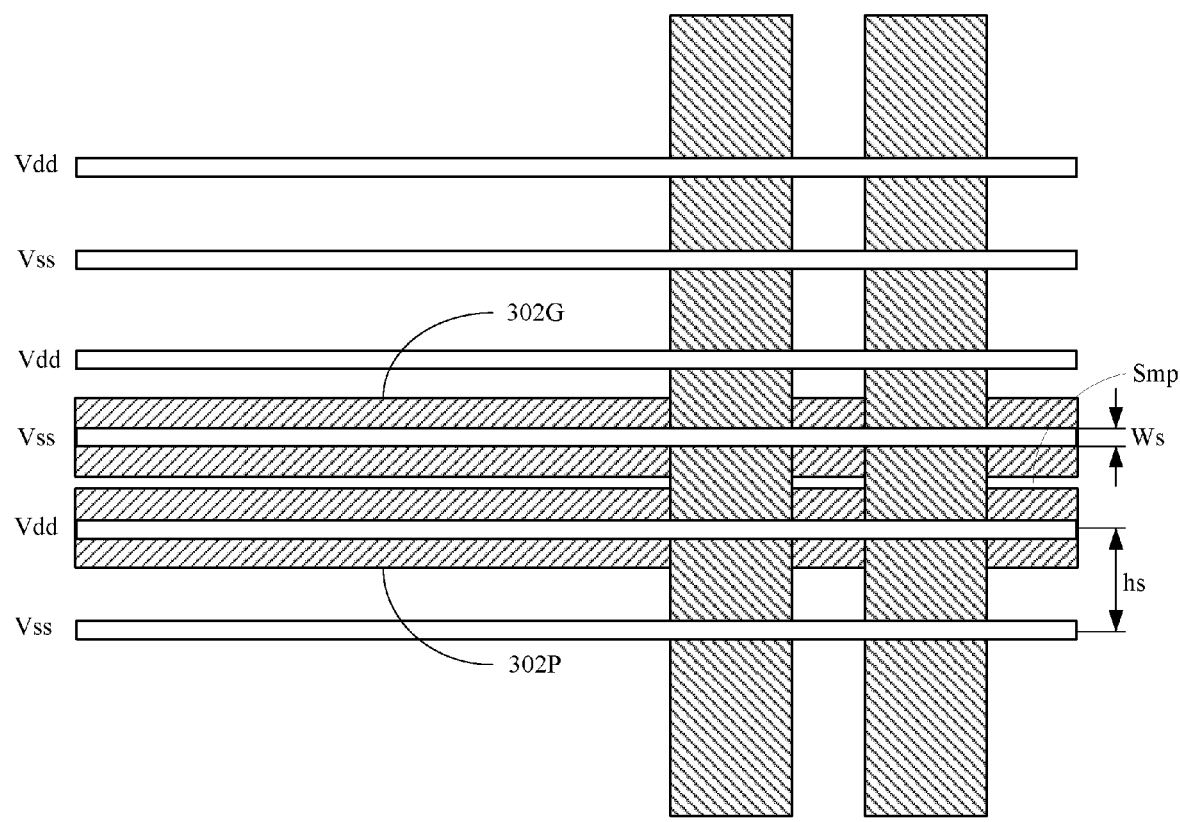
FIG. 3 is a layout structure of a P/G network according to another embodiment of the present invention.

In another case, the horizontal metal lines are directly adjacent to each other, as shown in the embodiment of FIG. 3. FIG. 3 shows a plurality of horizontal metal lines including horizontal power metal lines and horizontal ground metal lines that are more closely arranged. In this case, obviously, if the horizontal ground metal lines and the horizontal power metal lines have the same widths, then their maximum width is that:

When two metal lines are directly adjacent to each other, the width of the horizontal metal lines should not be larger than:

hs−Smp, that is, 1.5×standard height−0.5×interval between metal lines−0.5×line width of standard cell−1×inter-line interval wherein the interval between metal lines is the interval that should be reserved between two horizontal metal lines.

The interval between the metal lines is reserved to meet the design requirements of the integrated circuits, including IR drop, power consumption, noise, design rules for the integrated circuit and repeatability of the rows of the standard cells. Thus, the inter-line interval Sp is calculated based on at least one of the factors: IR drop, power consumption, noise, design rules for the integrated circuit and repeatability of the rows of the standard cells.

The maximum width in the above example requires the horizontal power metal lines and the horizontal ground metal lines to be equal in widths, which is a preferable choice for obtaining a more advantageous performance of the integrated circuit according to an embodiment. If they are not equal in widths, then when one metal line is reduced in width, its neighboring metal lines may have an increase in width, however, this width will not exceed 2hs−Ws−2Sp.

FIG. 3 shows the structure for an embodiment with metal lines at both sides. Similarly, FIG. 3 is viewed from a bottom-up perspective. In this configuration, each horizontal metal line, including the horizontal power metal line 302P and the horizontal ground metal line 302G, is equal in width, and their maximum width is given by 2hs−Ws−2Sp. Of course, based on the factors such as IR drop, power consumption, noise, design rules for the integrated circuit and repeatability of the rows of the standard cells, actual layout may have metal lines with a smaller width than described above.

The arrangements for the horizontal metal lines in the P/G network of the present invention have been described above. After the arrangements of horizontal metal lines, the vertical metal lines in the present invention can be located on a plane one layer higher or lower than the plane on which the horizontal metal lines reside.

Figure 4:
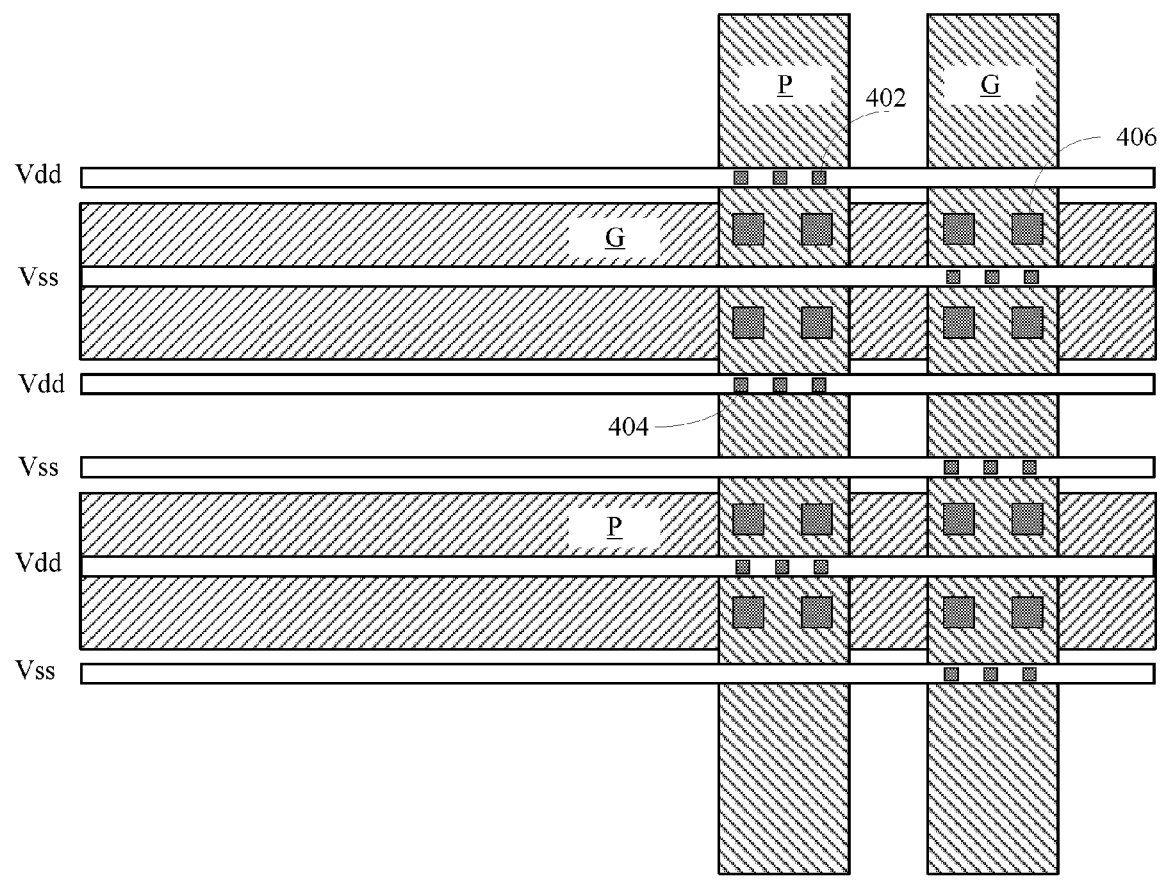
FIG. 4 is a schematic diagram illustrating the connections of the P/G network and the power/ground lines of the standard cells according to an embodiment of the present invention.

As described above, the power lines and the ground lines of the horizontal metal lines are interconnected to the power lines and the ground lines of the vertical metal lines, respectively, and the power lines and the ground lines of the vertical metal lines are interconnected to the power lines and ground lines of the standard cells, respectively. According to an embodiment of the present invention, these connections are achieved through vias, such as those shown in FIG. 4 (similarly, FIG. 4 is viewed from a bottom-up perspective). FIG. 4 is a schematic diagram illustrating the connections of the P/G network and the power/ground lines of the standard cells according to an embodiment of the present invention. As can be seen from the drawing, the present invention allows metal lines above to interconnect with each other through vias between different metal layers, including vias 402 connecting the vertical metal lines and the lines of the standard cells and vias 402 connecting the vertical metal lines and the horizontal metal lines.

The density of the horizontal metal lines and vertical metal lines in the P/G network of the present invention (i.e. grid density of the P/G network) can be calculated based on at least one of the factors: IR drop, power consumption, noise, design rules for the integrated circuit and repeatability of the rows of the standard cells.

Structure of Integrated Circuit

According to another aspect of the present invention, based on the above P/G network, the present invention further provides a structure of an integrated circuit, including rows of standard cells and a P/G network, wherein the rows of the standard cells in the integrated circuit are horizontally arranged. The P/G network includes horizontal and vertical metal lines arranged in different metal layers. The horizontal metal lines include horizontal power metal lines and horizontal ground lines. The vertical metal lines include vertical power metal lines and vertical ground lines. The power lines and the ground lines in the horizontal metal lines and the vertical metal lines are interconnected, respectively. The width of the horizontal metal wires in the P/G network is such that the horizontal power metal lines only cover the power lines in the rows of the standard cells, while the horizontal ground metal lines only cover the ground lines of the rows of the standard cells.

Similar to the descriptions above, the horizontal power metal lines in the horizontal metal lines of the P/G network in the integrated circuit structure of the present invention only cover the power lines in the standard cells and the horizontal ground metal lines only cover the ground lines in the standard cells. Without any overlapping, the connection problem of power lines and ground lines of the standard cells as a result of metal line width being too large as in the prior art can be avoided. Referring to FIG. 2, it can observed from the structure and basic arrangement of the standard cells that the distance between the ground line Vss and the power line Vdd of each standard cell is equal to the height of a single standard cell, that is standard height hs (it should be noted that when considering the widths of Vss and Vdd, the standard height hs is the distance between the center line of Vdd to the center line of Vss). The maximum width possible for any horizontal metal line (horizontal power metal line or horizontal ground metal line) without overlapping is 2hs, that is twice the standard height.

In physical applications, the widths of Vss and Vdd need to be taken into account. In this case, for metal wires that do not have a metal wire right next to it, their width should be not larger than:

2hs−Ws−2Sp, that is, 2×standard height−1×line width of standard cell−2×inter-line interval wherein, the line width Ws of a standard cell is the width of a power line or the width of a ground line of a standard cell, which are identical, and the inter-line interval Sp is the interval that should be reserved between a horizontal metal line and a power or a ground line of a standard cell.

Similarly, for the integrated circuit structure, the inter-line interval in the P/G network is reserved to meet the design requirements of the integrated circuits, including IR drop, power consumption, noise, design rules for the integrated circuit and repeatability of the rows of the standard cells. Thus, the inter-line interval Sp is calculated based on at least one of the factors: IR drop, power consumption, noise, design rules for the integrated circuit and repeatability of the rows of the standard cells.

FIG. 2 shows the structure for a configuration where metal lines have no neighboring metal lines at both sides thereof. Similarly, FIG. 2 is viewed from a bottom-up perspective. In this configuration, there are no metal line at either side of horizontal power metal line 202P and horizontal ground metal line 202G, thus there width is given by 2hs−Ws−2Sp. Of course, based on the factors such as IR drop, power consumption, noise, design rules for the integrated circuit and repeatability of the rows of the standard cells, actual layout may have metal lines with a smaller width than described above.

In another case, the horizontal metal lines are directly adjacent to each other, as shown in the embodiment of FIG. 3. FIG. 3 shows a plurality of horizontal metal lines including horizontal power metal lines and horizontal ground metal lines that are more closely arranged. In this case, obviously, if the horizontal ground metal lines and the horizontal power metal lines have the same widths, then their maximum width is that:

When two metal lines are directly adjacent to each other, the width of the horizontal metal lines should not be larger than:

hs−Smp, that is, 1.5×standard height−0.5×interval between metal lines−0.5×line width of standard cell−1×inter-line interval wherein the interval between metal lines is the interval that should be reserved between two horizontal metal lines.

Similarly, for the integrated circuit structure, the interval between two metal lines in the P/G network is reserved to meet the design requirements of the integrated circuits, including IR drop, power consumption, noise, design rules for the integrated circuit and repeatability of the rows of the standard cells. Thus, the inter-line interval Sp is calculated based on at least one of the factors: IR drop, power consumption, noise, design rules for the integrated circuit and repeatability of the rows of the standard cells.

The maximum width in the above example requires the horizontal power metal lines and the horizontal ground metal lines to be equal in widths, which is a preferable choice for obtaining a more advantageous performance of the integrated circuit according to an embodiment. If they are not equal in widths, then when one metal line is reduced in width, its neighboring metal lines may have an increase in width, however, this width will not exceed 2hs−Ws−2Sp.

FIG. 3 shows the structure for an embodiment with metal lines at both sides. Similarly, FIG. 3 is viewed from a bottom-up perspective. In this configuration, each horizontal metal line, including the horizontal power metal line 302P and the horizontal ground metal line 302G, is equal in width, and their maximum width is given by 2hs−Ws−2Sp. Of course, based on the factors such as IR drop, power consumption, noise, design rules for the integrated circuit and repeatability of the rows of the standard cells, actual layout may have metal lines with a smaller width than described above.

In terms of the integrated circuit structure, after the arrangements of horizontal metal lines, the vertical metal lines in the present invention can be located on a plane one layer higher or lower than the plane on which the horizontal metal lines reside.

Similarly, in the integrated circuit structure, the power lines and the ground lines of the horizontal metal lines are interconnected to the power lines and the ground lines of the vertical metal lines, respectively, and the power lines and the ground lines of the vertical metal lines are interconnected to the power lines and ground lines of the standard cells, respectively. According to an embodiment of the present invention, these connections are achieved through vias, such as those shown in FIG. 4 (similarly, FIG. 4 is viewed from a bottom-up perspective). FIG. 4 is a schematic diagram illustrating the connections of the P/G network and the power/ground lines of the standard cells according to an embodiment of the present invention. As can be seen from the drawing, the present invention allows metal lines above to interconnect with each other through vias between different metal layers, including vias 402 connecting the vertical metal lines and the lines of the standard cells and vias 402 connecting the vertical metal lines and the horizontal metal lines.

The density of the horizontal metal lines and vertical metal lines in the P/G network of the present invention (i.e. grid density of the P/G network) can be calculated based on at least one of the factors: IR drop, power consumption, noise, design rules for the integrated circuit and repeatability of the rows of the standard cells.

Method for Arranging P/G Network

According to another aspect of the present invention, a method for arranging a P/G network of an integrated circuit is proposed, wherein rows of standard cells in the integrated circuit are arranged in the horizontal direction. FIG. 5 is a flow chart illustrating the method for arranging a P/G network of an integrated circuit according to an embodiment of the present invention. The method includes:

disposing horizontal metal lines and vertical metal lines in different metal layers, wherein the horizontal metal lines includes horizontal power metal lines and horizontal ground metal lines while the vertical metal lines includes vertical power metal lines and vertical ground metal lines, wherein the step of disposing horizontal metal lines and vertical metal lines includes setting a width of the horizontal metal lines of the P/G network such that the horizontal power metal lines only cover the power lines of rows of the standard cells, while the horizontal ground metal lines only cover the ground lines of rows of the standard cells;

connecting the power lines and the ground lines of the horizontal metal lines to the power lines and the ground lines of the vertical metal lines, respectively; and connecting the power lines and the ground lines of the vertical metal lines to the power lines and the ground lines of the rows of the standard cells, respectively.

Similarly, from the discussions above, according to the present invention, the width of the horizontal metal lines is set to be smaller than twice the standard height of the standard cells, i.e. less than 2hs.

For metal wires that do not have a metal wire right next to it, the width of the metal wires is set to be not larger than:

$$2hs-Ws-2Sp, \text{ that is, } 2\times\text{standard height}-1\times\text{line width of standard cell}-2\times\text{inter-line interval}$$

wherein, the line width Ws of a standard cell is the width of a power line or the width of a ground line of a standard cell, which are identical, and the inter-line interval Sp is the interval that should be reserved between a horizontal metal line and a power or a ground line of a standard cell.

The inter-line interval is reserved to meet the design requirements of the integrated circuits, including IR drop, power consumption, noise, design rules for the integrated circuit and repeatability of the rows of the standard cells. Thus, the inter-line interval Sp is calculated based on at least one of the factors: IR drop, power consumption, noise, design rules for the integrated circuit and repeatability of the rows of the standard cells.

When two metal lines are directly adjacent to each other, the width of the horizontal metal lines is set to be not larger than:

$$hs-Smp, \text{ that is, } 1.5\times\text{standard height}-0.5\times\text{interval between metal lines}-0.5\times\text{line width of standard cell}-1\times\text{inter-line interval}$$

wherein the interval between metal lines is the interval that should be reserved between two horizontal metal lines.

The interval between the metal lines is reserved to meet the design requirements of the integrated circuits, including IR drop, power consumption, noise, design rules for the integrated circuit and repeatability of the rows of the standard cells. Thus, the inter-line interval Sp is calculated based on at least one of the factors: IR drop, power consumption, noise, design rules for the integrated circuit and repeatability of the rows of the standard cells.

The maximum width above is suitable in applications where the horizontal power metal lines and the horizontal ground metal lines are equal in widths, which is a preferable choice for obtaining a more advantageous performance of the integrated circuit. If they are not equal in widths, then when one metal line is reduced in width, its neighboring metal lines may have an increase in width, however, this width will not exceed $2hs-Ws-2Sp$.

Moreover, continuing referring to the embodiment of FIG. 5, the present invention further includes the following steps:

disposing the vertical metal lines on a plane one layer higher or lower than the plane on which the horizontal metal lines reside;

calculating the density of the horizontal metal lines and vertical metal lines based on at least one of the factors: IR drop, power consumption, noise, design rules for the integrated circuit and repeatability of the rows of the standard cells; and providing vias so that the power lines and the ground lines of the horizontal metal lines are respectively connected to the power lines and the ground lines of the vertical metal lines, and the power lines and the ground lines of the vertical metal lines are respectively connected to the power lines and the ground lines of the standard cells. As can be seen in FIG. 4, there are vias 402 connecting the vertical metal lines and the lines of the standard cells and vias 402 connecting the vertical metal lines and the horizontal metal lines.

By employing the technical features of the present invention compliant with the conditions of IR drop, power consumption and noise, the metal line width can be determined based on the design rules for integrated circuit and the repeatability of the rows of the standard cells, thus avoiding function failure or waste of layout resources due to overlapping or inappropriate line width, thereby accommodating the requirement for increasing number of circuit units.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A power/ground (P/G) network of an integrated circuit, wherein rows of standard cells in the integrated circuit are horizontally arranged, the P/G network including horizontal and vertical metal lines arranged in different metal layers, the horizontal metal lines including horizontal power metal lines and horizontal ground lines, the vertical metal lines including vertical power metal lines and vertical ground lines, the power lines and the ground lines in the horizontal metal lines respectively interconnected with the power lines and the ground lines of the vertical metal lines; the P/G network being characterized in that:
the width of the horizontal metal lines in the P/G network is such that the horizontal power metal lines only cover the power lines in the rows of the standard cells, while the horizontal ground lines only cover the ground lines of the rows of the standard cells, wherein when two horizontal metal lines are directly adjacent to each other, the width of the horizontal metal lines being smaller than:
1.5×standard height−0.5×interval between metal lines−0.5×line width of standard cell−1×inter-line interval,
wherein the interval between the metal lines is the interval that should be reserved between two horizontal metal lines.

2. The P/G network of claim 1, wherein the width of the horizontal metal lines is smaller than twice a standard height of the standard cells.

3. The P/G network of claim 2, wherein the width of the horizontal metal lines is smaller than:
2×standard height−1×line width of a standard cell−2×inter-line interval,
wherein the line width of a standard cell is the width of a power line or the width of a ground line of a standard cell, which are identical, and the inter-line interval is the interval that should be reserved between a horizontal metal line and a power or a ground line of a standard cell.

4. The P/G network of claim 3, wherein the inter-line interval is calculated based on at least one of the factors including IR drop, power consumption, noise, design rules for the integrated circuit and repeatability of the rows of the standard cells.

5. The P/G network of claim 1, wherein the interval between the metal lines is calculated based on at least one of the factors including IR drop, power consumption, noise, design rules for the integrated circuit and repeatability of the rows of the standard cells.

6. The P/G network of claim 1, wherein the vertical metal lines reside on a metal layer that is closer to the lines of the standard cells than that for the horizontal metal lines.

7. The P/G network of claim 6, wherein the vertical metal lines resides on a metal layer that is one layer higher or lower than that for the horizontal metal lines.

8. The P/G network of claim 6, wherein the density of the horizontal metal lines and vertical metal lines is calculated based on at least one of the factors including IR drop, power consumption, noise, design rules for the integrated circuit and repeatability of the rows of the standard cells.

9. The P/G network of claim 6, wherein the power lines and the ground lines of the horizontal metal lines respectively connected to the power lines and the ground lines of the vertical metal lines, and the power lines and the ground lines of the vertical metal lines respectively connected to the power lines and the ground lines of the standard cells are achieved through vias.

10. An integrated circuit structure, including rows of standard cells and a P/G network, wherein rows of standard cells in the integrated circuit are horizontally arranged, the P/G network including horizontal and vertical metal lines arranged in different metal layers, the horizontal metal lines including horizontal power metal lines and horizontal ground lines, the vertical metal lines including vertical power metal lines and vertical ground lines, the power lines and the ground lines in the horizontal metal lines respectively interconnected with the power lines and the ground lines of the vertical metal lines, the structure being characterized in that
the width of the horizontal metal lines in the P/G network is such that the horizontal power metal lines only cover the power lines in the rows of the standard cells, while the horizontal ground lines only cover the ground lines of the rows of the standard cells, wherein when two horizontal metal lines are directly adjacent to each other, the width of the horizontal metal lines being smaller than:
1.5×standard height−0.5×interval between metal lines−0.5×line width of standard cell−1×inter-line interval,
wherein the interval between the metal lines is the interval that should be reserved between two horizontal metal lines.

11. The integrated circuit structure of claim 10, wherein the width of the horizontal metal lines is smaller than twice a standard height of the standard cells.

12. The integrated circuit structure of claim 11, wherein the width of the horizontal metal lines is smaller than:
2×standard height−1×line width of a standard cell−2×inter-line interval,
wherein the line width of a standard cell is the width of a power line or the width of a ground line of a standard cell, which are identical, and the inter-line interval is the interval that should be reserved between a horizontal metal line and a power or a ground line of a standard cell.

13. The integrated circuit structure of claim 12, wherein the inter-line interval is calculated based on at least one of the factors including IR drop, power consumption, noise, design rules for the integrated circuit and repeatability of the rows of the standard cells.

14. The integrated circuit structure of claim 10, wherein the interval between the metal lines is calculated based on at least one of the factors including IR drop, power consumption, noise, design rules for the integrated circuit and repeatability of the rows of the standard cells.

15. The integrated circuit structure of claim 10, wherein the vertical metal lines resides on a metal layer that is one layer higher or lower than that for the horizontal metal lines.

16. The integrated circuit structure of claim 15, wherein the density of the horizontal metal lines and vertical metal lines is calculated based on at least one of the factors including IR drop, power consumption, noise, design rules for the integrated circuit and repeatability of the rows of the standard cells.

17. The integrated circuit structure of claim 15, wherein the power lines and the ground lines of the horizontal metal lines respectively connected to the power lines and the ground lines of the vertical metal lines, and the power lines and the ground lines of the vertical metal lines respectively connected to the power lines and the ground lines of the standard cells are achieved through vias.

18. A method for arranging a P/G network of an integrated circuit, wherein rows of standard cells in the integrated circuit are arranged in the horizontal direction, the method including:

disposing horizontal metal lines and vertical metal lines in different metal layers, wherein the horizontal metal lines includes horizontal power metal lines and horizontal ground lines while the vertical metal lines includes vertical power metal lines and vertical ground metal lines;

connecting the power lines and the ground lines of the horizontal metal lines to the power lines and the ground lines of the vertical metal lines, respectively; and connecting the power lines and the ground lines of the vertical metal lines to the power lines and the ground lines of the rows of the standard cells, respectively, wherein the step of disposing horizontal metal lines and vertical metal lines includes setting a width of the horizontal metal lines of the P/G network such that the horizontal power metal lines only cover the power lines of rows of the standard cells, while the horizontal ground lines only cover the ground lines of rows of the standard cells, wherein when two horizontal metal lines are directly adjacent to each other, the width of the horizontal metal lines setting to be smaller than:

1.5×standard height−0.5×interval between metal lines−0.5×line width of standard cell−1×inter-line interval, wherein the interval between the metal lines is the interval that should be reserved between two horizontal metal lines.

19. The method of claim 18, wherein the width of the horizontal metal lines is set to be smaller than twice a standard height of the standard cells.

20. The method of claim 19, wherein the width of the horizontal metal lines is set to be smaller than:

2×standard height−1×line width of a standard cell−2×inter-line interval, wherein the line width of a standard cell is the width of a power line or the width of a ground line of a standard cell, which are identical, and the inter-line interval is the interval that should be reserved between a horizontal metal line and a power or a ground line of a standard cell.

21. The method of claim 20, further including calculating the inter-line interval based on at least one of the factors including IR drop, power consumption, noise, design rules for the integrated circuit and repeatability of the rows of the standard cells.

22. The method of claim 18, further including calculating the interval between the metal lines based on at least one of the factors including IR drop, power consumption, noise, design rules for the integrated circuit and repeatability of the rows of the standard cells.

23. The method of claim 22, wherein the vertical metal lines is disposed on a metal layer that is one layer higher or lower than that for the horizontal metal lines.

24. The method of claim 22, further including calculating the density of the horizontal metal lines and vertical metal lines based on at least one of the factors including IR drop, power consumption, noise, design rules for the integrated circuit and repeatability of the rows of the standard cells.

25. The method of claim 22, further including providing vias so that the power lines and the ground lines of the horizontal metal lines are respectively connected to the power lines and the ground lines of the vertical metal lines, and the power lines and the ground lines of the vertical metal lines are respectively connected to the power lines and the ground lines of the standard cells.

\* \* \* \* \*